Figure 1:
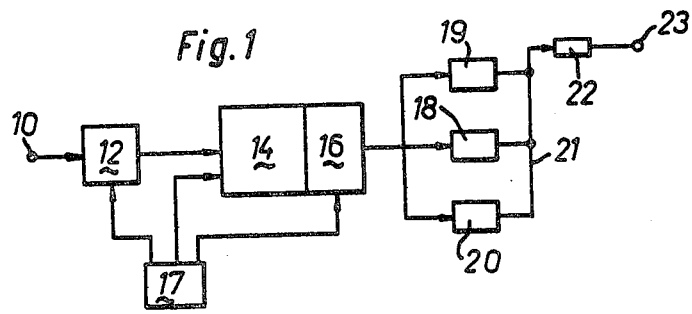

United States Patent [19]

Furrer et al.

[11] Patent Number: 4,488,121
[45] Date of Patent: Dec. 11, 1984

[54] METHOD AND APPARATUS FOR AMPLIFYING AN ANALOG LOW-FREQUENCY SIGNAL BY A SWITCHING AMPLIFIER

[75] Inventors: Andreas Furrer, Schneisingen; Vaclau Mertl, Dübendorf; Johann Milavec, Windisch; Herbert Stemmler, Kirchdorf, all of Switzerland

[73] Assignee: BBC Brown, Boveri & Company, Limited, Baden, Switzerland

[21] Appl. No.: 343,770

[22] Filed: Jan. 28, 1982

[30] Foreign Application Priority Data

Feb. 16, 1981 [CH] Switzerland .................... 992/81

[51] Int. Cl.³ .............................................. H03F 3/38
[52] U.S. Cl. ................................... 330/10; 330/124 R
[58] Field of Search ................... 330/9, 10, 51, 124 R, 330/295; 332/9

[56] References Cited

U.S. PATENT DOCUMENTS

| 4,068,228 | 1/1978 | Vallas ............................. 330/124 R |
| 4,399,558 | 8/1983 | Smollin ................................. 332/9 |
| 4,403,197 | 9/1983 | Swanson ............................. 330/10 |

*Primary Examiner*—James B. Mullins
*Assistant Examiner*—G. Wan
*Attorney, Agent, or Firm*—Oblon, Fisher, Spivak, McClelland & Maier

[57] ABSTRACT

A method of amplifying an analog low-frequency signal, and a switching amplifier implementing the method, wherein the maximum amplifiable voltage of the analog input signal is divided up into as many voltage bands as there are switching stages provided in the switching amplifier, and one switching stage is associated with each voltage band. Thereby the number of switching stages actuated and their switched-on period may be modulated in dependence upon the amplitude. In this way it is possible to reduce considerably the total number of switching processes during one period of the low-frequency input signal and the losses connected with each switching process.

6 Claims, 4 Drawing Figures

METHOD AND APPARATUS FOR AMPLIFYING AN ANALOG LOW-FREQUENCY SIGNAL BY A SWITCHING AMPLIFIER

BACKGROUND OF THE INVENTION

1. Field of the Invention

This invention relates to a method of amplifying an analog low-frequency signal by a switching amplifier which contains a number of switching stages which can be actuated independently of one another and the outputs from which are connected to a lowpass filter.

2. Description of the Prior Art

The amplification of analog signals by a switching amplifier may, in spite of the necessary conversion of the analog control signal into a control signal in pulse form and the conversion of the amplified pulsed output signal back into an analog output signal, be advantageous because all of the steps of the method may be performed with modern solid-state components, which in general permits a more compact construction and a longer working life of the amplifier as well as a considerable reduction in the stray power.

In the case of the methods known hitherto the switch members in the switching stages are actuated by pulse trains, the pulses in which exhibit a constant repetition rate and are width-modulated in accordance with the converted analog signal. Preferably two pulse trains are generated, the pulses in which are shifted in phase by 180°.

Such a switching amplifier is described, for example, in British Pat. No. 1,248,209 (Plessey Co. Ltd.). In the case of this amplifier the amplitude-modulated analog input signal is converted into a pair of pulse trains having width-modulated pulses shifted in phase by 180°. Each pulse train controls one of the two switching transistors which are connected to the ends of the primary winding of a pulse transformer. The center tapping of this primary winding is connected to a source of supply voltage so that the pulse transformer is excited in push-pull. The secondary winding of the transformer is connected via a bridge rectifier to a lowpass filter at the output from which appears an analog signal which corresponds with the amplified input signal.

The output power from this switching amplifier is limited by the power which can be transformed by the one pulse transformer, and during amplification the pulses are deformed, wherefore the possibilities of employment of this switching amplifier are restricted.

That is why a switching amplifier has already been proposed (Swiss Patent Application No. 7307/79) which contains a plurality of switching stages for raising the switching power. In the case of this switching amplifier the analog input signal is converted into at least one pair of pulse trains, the two pulse trains shifted in phase by 180° consisting of width-modulated pulses of constant repetition rate. Each of the switching stages contains two switching channels independent of one another, and each switching channel contains one pulse transformer, the primary winding of which is connected to one switch member. The one pulse train of the pair of pulse trains is provided for the control of the switch members in the first switching channels of the switching stages and the other pulse train is provided for the control of the switch members in the second switching channels. The secondary windings of all of the pulse transformers are connected in series for summing up the pulses transformed. The one output from each secondary winding is connected via a rectifier to the series lead and a further rectifier is provided in the series lead between the connections of the two outputs from each secondary winding.

In the case of a practically tested embodiment of this switching amplifier the switch members in 48 switching stages were controlled by each pulse train. The supply voltage for the primary windings of the pulse transformers was 500 volts and the transformation ratio selected as 1:1.2, so that at the end of the series circuit of the secondary windings of the transformers, amplified pulses were obtained having a peak voltage of up to 28 kV.

The insulation required between the secondary and primary windings of the pulse transformers forms at the aforesaid peak voltage an undesirable capacitance which is charged up and discharged at each switching or transformation process. The reversal of charge is connected with a relatively high stray power and at high switching frequencies may even bring about a deformation of the pulse transformed and thereby a distortion of the amplified analog signal.

SUMMARY OF THE INVENTION

The object of the present invention is therefore to create a method of amplification of an analog low-frequency signal in which the duration of switching-on of the switching stages is prolonged in each conversion period and in return the number of switching stages which have to be switched on is reduced.

In accordance with the invention this object is achieved by a method of the kind mentioned initially, wherein the permissible input voltage to the amplifier is divided up into a number of voltage bands of equal size and at least one switching stage is associated with each voltage band, and wherein at predetermined intervals of time the instantaneous value of the amplitude of the input signal is measured and the number of voltage bands is determined the sum of which is equal to this instantaneous value or less than it by less than one voltage band, and this sum is compared with the sum calculated in the same way in the case of the preceding measurement of the instantaneous value, after which a number of switching stages corresponding to the difference between these two sums is switched off or additionally switched on.

While in the case of the methods usual hitherto, in each conversation period all of the switching stages of the amplifier were switched by width-modulated control pulses, the method of the invention enables only a number of switching stages determined by the instantaneous value of the amplitude of the input signal to be switched on during an optimum period of time determined by the saturation of the transformer. The number of switching processes in each conversion period can thus be quite considerably reduced and thereby also the losses brought about by the switching processes and the deformations of the transformed pulse.

Figure 2:
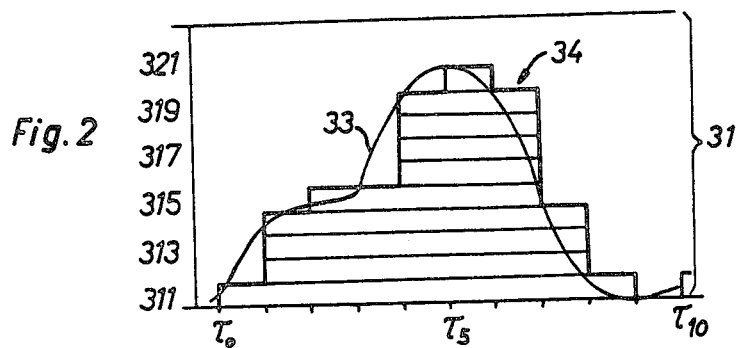
Figure 3:
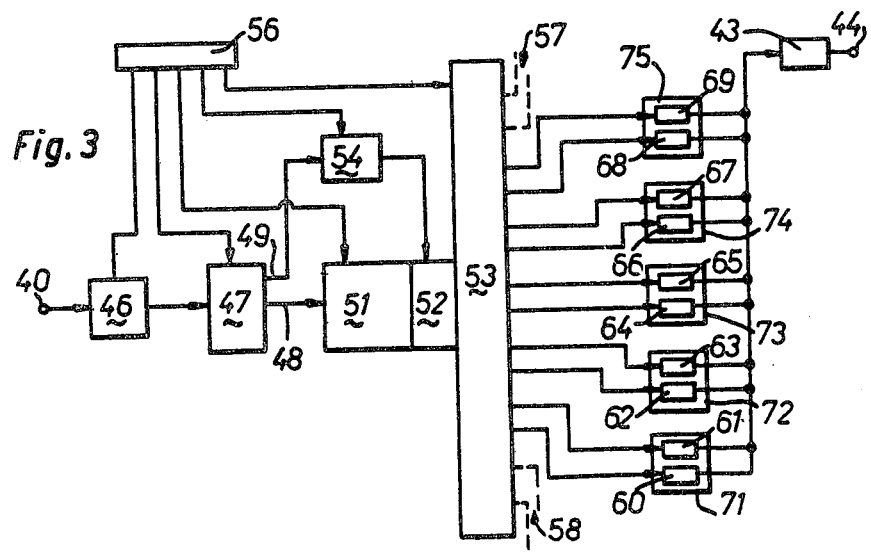
Figure 4:
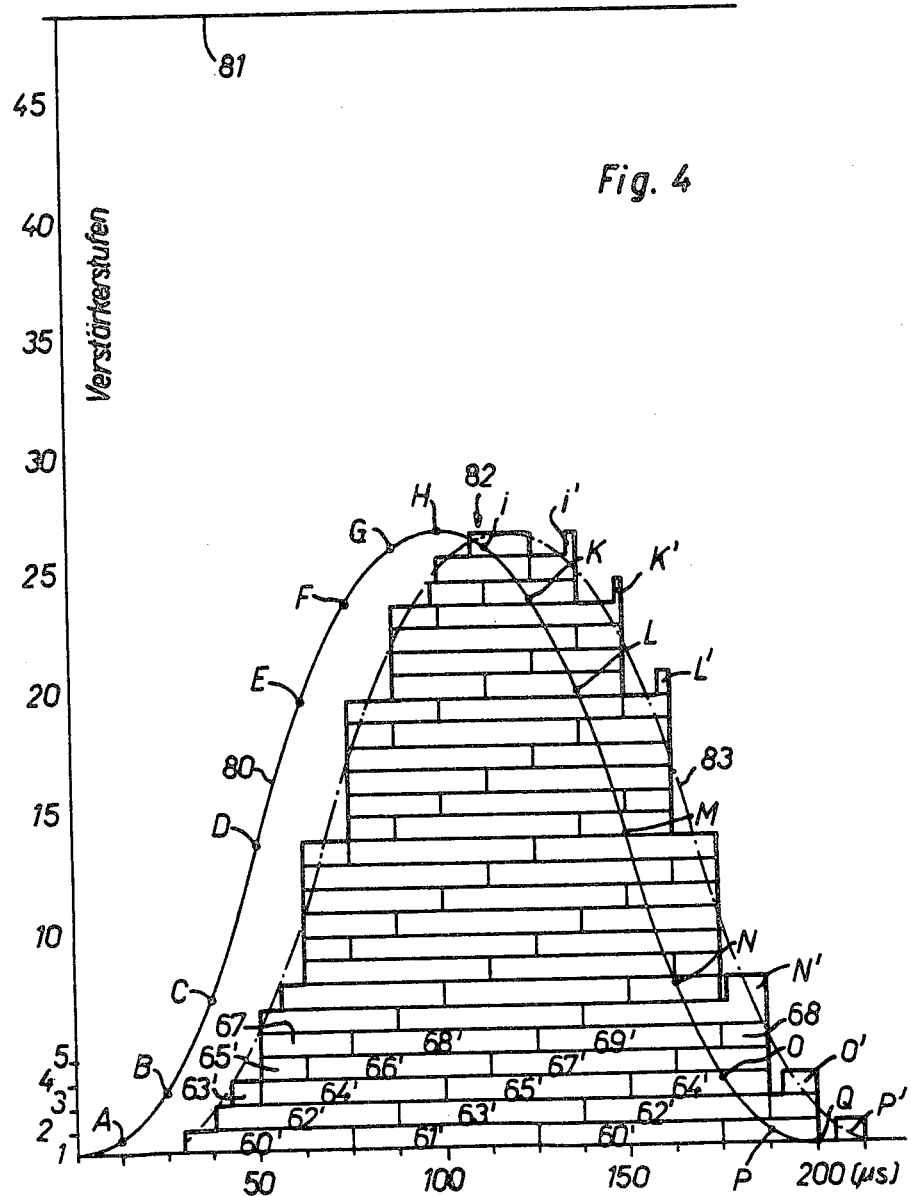

In a preferred embodiment of the method of the invention each voltage band is subdivided into a predetermined number of sub-bands, and upon measuring an instantaneous value which lies between two sums of the voltage bands, so that after determining the sum a remainder of amplitude is left, a further switching stage is pulse-duration modulated, ie. it is switched on with a time delay or switched off early, in doing which the ratio of the length of time switched on to the interval of FIG. 2 is a waveform diagram relating to the operation of an FSK demodulator;

FIG. 3 schematically illustrates an FSK demodulator in accordance with the invention; and FIG. 4 illustrates in detail an FSK demodulator in accordance with a preferred embodiment of the invention.

Referring to FIG. 1, a known form of FSK demodulator comprises a phase locked loop (PLL) 10 to which an FSK input signal is supplied via a wire 12. The PLL 10 comprises a voltage controlled oscillator (VCO) 14, whose center frequency is determined by the magnitudes of a timing capacitor 16 and a resistor 18 connected to a control input of the VCO, a phase detector 20 which is supplied with the FSK input signal on the wire 12 and the output of the VCO 14, and a PLL filter comprising a resistor 22 and a capacitor 24 which are connected between the output of the phase detector 20 and respectively the control input of the VCO and circuit ground.

The output voltage of the PLL, produced at a junction 26, is coupled to the non-inverting input of a voltage comparator 28 via a low pass data filter comprising a series resistor 30 and a shunt capacitor 32. A reference voltage, which corresponds to the nominal center frequency of the FSK input signal, is supplied from a voltage reference source 34 to the inverting input of the comparator 28, which is also coupled to circuit ground via a capacitor 36. The demodulated data output is produced on a wire 38 connected to the output of the comparator 28, which is also coupled to the non-inverting input of the comparator via a resistor 40 to provide positive feedback for rapid switching of the comparator.

FIG. 2 shows waveforms illustrating the operation of the FSK demodulator, the upper diagram illustrating the output voltage 42 of the PLL at the junction 26, and the middle and lower diagrams illustrating possible forms of the resultant data output on the wire 38, for an arbitrary data bit sequence having equal marks and spaces.

As shown in FIG. 2, the voltage 42 at the junction 26 varies uniformly on either side of a voltage Va which corresponds to the actual center frequency of the FSK input signal. If the voltage Va is equal to the reference voltage supplied by the source 34, and thus if the actual center frequency is equal to the nominal center frequency to which the VCO 14 is tuned, then the resultant demodulated data has an undistorted mark/space ratio as shown by the waveform 44 in the middle diagram of FIG. 2. If, however, the actual center frequency of the FSK input signal has changed from the nominal center frequency, so that the voltage Va differs from the reference voltage, then the mark/space ratio of the demodulated data is distorted. For example if relative to the voltage Va the reference voltage is Vr as shown by a dotted line in the upper diagram of FIG. 2, then the resultant demodulated data has the waveform 46 in the lower diagram of FIG. 2. If transitions such as the 0-to-1 transition 48 of the waveform 46 are used to determine sampling times t for sampling the demodulated data, errors can occur in the sampled data due to the distorted mark/space ratio of the waveform 46.

FIG. 3 illustrates an FSK demodulator in accordance with the invention, in which the above-described disadvantage of the prior art is avoided or at least substantially reduced. The demodulator of FIG. 3 is the same as that of FIG. 1, and the components thereof are accordingly designated by the same references, except for the addition in the demodulator of FIG. 3 of a capacitor 50 and two zener diodes 52. The capacitor 50 serves to couple the output of the data filter, comprising the resistor 30 and the capacitor 32, to the non-inverting input of the comparator 28, in place of the direct connection in FIG. 1. Thus the capacitor 50 blocks the d.c. component Va of the PLL output from being applied to the comparator 28. The zener diodes 52, which are series-connected and oppositely-poled, are connected between the non-inverting input of the comparator 28 and the voltage reference source 34, and hence between the two inputs of the comparator 28, to maintain the average voltage level at the non-inverting input of the comparator 28 at substantially the reference voltage Vr.

Thus the capacitor 50 blocks the d.c. component Va, and the diodes 52 restore a d.c. component Vr, in the output voltage of the PLL 10 before application thereof to the comparator 28. As the d.c. component Vr is supplied to both inputs of the comparator 28, the mark/space ratio of the demodulated data at the output of the comparator is relatively undistorted. This is the case even for large changes (within the PLL capture range which should be much larger than the range over which the actual center frequency is expected to vary) of the actual center frequency of the FSK input signal from the nominal center frequency, and hence for large differences between the voltages Va and Vr.

In place of the two zener diodes 52 other d.c. restoring means, for example other diode means such as back-to-back conventional diodes or varistors, may be used to maintain the non-inverting input of the comparator 28 at substantially the d.c. reference voltage.

A problem which may arise with the capacitive coupling arrangement shown in FIG. 3 is that, in the absence of phase lock such as occurs if no FSK input signal is present, the capacitor 50 may adopt a charge which adversely affects operation of the FSK demodulator when an FSK input signal appears and phase lock is achieved. In order to avoid this, in a preferred embodiment of the invention described below with reference to FIG. 4 means are provided for determining the charge on the capacitor when there is no phase lock.

In FIG. 4 the same references as in FIGS. 1 and 3 are used to denote similar components, which accordingly are not described again below. The components 14, 20, 28, and 34 form part of an integrated circuit type XR-2211 by Exar Integrated Systems, Inc., which integrated circuit is shown within a broken line box 54 in FIG. 4, which also shows the pin numbers for connections to the integrated circuit. In addition to the components 14, 20, 28, and 34, the integrated circuit includes an FSK input signal pre-amplifier 56, a quadrature phase detector 58, and a lock detect comparator 60.

The FSK input signal is coupled via a capacitor 62 to the wire 12, which is coupled to circuit ground via a high impedance resistor 64 and is connected to the input pin 2 of the pre-amplifier 56. The output of the pre-amplifier 56 is connected to the loop phase detector 20 and also to the quadrature phase detector 58, whose output pin 3 is coupled to circuit ground via a parallel resistor 66 and capacitor 68 to eliminate chatter at output pins 5 and 6 described below. The output of the detector 58 is also connected to the inverting input, and the internal voltage reference is applied to the non-inverting input, of the lock detect comparator 60, which has complementary open-collector outputs at pins 5 and 6. A pull-up resistor 70 is connected to the pin 5 output, each of which is associated with a respective storage location and upon the appearance of a switching cycle passes the contents of the respective storage location as a control pulse to the control lead for the amplifier channel connected downstream of it. In FIG. 3 there are shown only the control leads for five switching stages 71 to 75, each of which contains two switching channels 60, 61; . . . 68, 69. Further control leads are indicated by the dotted lines 57, 58.

The output 49 from the divider circuit 47 is connected to an arithmetic unit 54 which calculates a control signal duration the ratio of which to the time interval between successive clock pulses corresponds to the difference between the remainder from substraction and the subtrahend. This duration-modulated control signal is fed to the roll-out circuit 52 which contains an associated delay circuit for each storage location in the store 51, and controls that delay circuit which is associated with the set storage location having the highest ordinal number. By the delayed transmission of the contents of the "last" set storage location a width-modulation of the control pulse for a switching channel is brought about, this width-modulation enabling the envelope of the output signals from the switching channels, superimposed in steps, to be adapted better to the analog signal.

In the case of the embodiment described the clock unit 56 generates two timing trains. One timing train having a frequency of 80 kHz is fed to the A/D converter and to the roll-out circuit; the other timing train having a frequency of 100 MHz controls the divider circuit and the arithmetic unit. It is thus possible to scan the amplitude of the analog signal at time intervals of 12.5 $\mu$s and to emit the control pulses for the switching channels at the same intervals. For compensating the time of calculation and storage the control pulses, which correspond to a scanning of the analog signal effected at a given time cycle, are only released by the control pulse generator during the succeeding time cycle.

As is described in detail in the already mentioned Swiss Patent Application No. 7307/79, each switching channel contains a pulse transformer which because of the unavoidable saturation can only transform pulses of up to about 50 $\mu$s duration. For transforming pulses of longer duration, therefore, in the proposed switching amplifier two switching channels 60,61; 62,63; 64,65; 66,67 and 68,69 are connected together into each switching stage 71,72,73,74 and 75 respectively. The control pulse generator 53 now causes control pulses the duration of which is longer than 50 $\mu$s to be fed alternately to one or other switching channel of the associated switching stage. Further, the pulse generator 53 causes the control pulses fed to the individual switching stages to be shifted with respect to one another by a time cycle of 12.5 $\mu$s. The result of this is that the switching channels in the energized switching stages do not get switched over simultaneously.

In FIG. 4 there is shown the formation of an analog signal by means of the switching pulses generated by the switching channels of a switching amplifier in accordance with FIG. 3. For that purpose let it be assumed that the analog input signal 80 of simple sine-wave shape, having a time duration of 200 $\mu$s, corresponding to a frequency of 5 kHz, is scanned in the A/D converter 46 every 12.5 $\mu$s, corresponding to a frequency of 80 kHz, and the scanned analog value appears as a digital value at the output from the converter. As has already been described above, the A/D converter enables the maximum convertible analog range 81 to be divided up into 1024 digital values, while the switching stages can only process 48 control pulses. The digital value appearing at the output from the A/D converter is therefore divided up in the succeeding divider circuit 47 into digital value stages, each of which contains 20 digital values. In FIG. 4 only the digital value stages are plotted on the ordinates.

For better understanding of the following description let it be again pointed out that the store 51 is built up in such a way that at each timing signal all of the storage locations which have not been set are reset.

Let it further be assumed that during the first time cycle at a zero point in time all of the storage locations are reset, ie., there exists no signal which can be rolled out. At this point in time the amplitude of the analog signal is also zero, wherefore after the scanning of the signal there appears at the output from the A/D converter the digital signal zero which is not further processed.

During the second time cycle at the point in time 12.5 $\mu$s all of the storage locations are still reset and no signal can be rolled out. In return, upon scanning the analog signal an analog value A is established which corresponds to about 18 digital values. At the output from the divider circuit there then appears on the lead 48 a "1" and on the lead 49 an "18", which means that even at the first substraction of (1024:48) digital values a remainder of 18 is left. Consequently one storage location is set in the store 51 and the arithmetic unit 54 delivers to the roll-out circuit 52 a delay signal which brings about the rolling-out of the contents of the store with a delay of about 2/20 of the cycle time, thus in the present example 1.25 $\mu$s.

During the third time cycle at the point in time 25 $\mu$s the content of the store is read out with the aforesaid delay and passed as a control signal in the form of a pulse to a control lead for one of the switching channels. At the same time the analog signal is scanned and in doing so the analog value B is established, which corresponds to about 50 digital values. At the output from the divider circuit there then appears on the lead 48 a "3" and on the lead 49 a "10", which means that upon substraction three times of (2024:48) digital values a remainder of 10 is left. Then three storage locations in the store 51 are set and the arithmetic unit 54 delivers to the roll-out circuit 52 a delay signal which during rolling-out of the contents of the store delays the contents of the third storage location by about 10/20 of the cycle time, ie., by 6.25 $\mu$s.

During the fourth time cycle at the point in time 37.5 $\mu$s the contents of the store are read out and a control signal is passed to each control lead which is associated with a storage location which has been set, in doing which the control signal corresponding to the storage location 3 is delayed as described above. At the same time the analog signal is scanned and the analog value C is converted into about 130 digital values. These digital values in the same way as already described above are divided into seven digital value stages which set seven storage locations in the store, of which the seventh is rolled out with a delay of 10/20 of the cycle time or 12.5 $\mu$s.

The analog signal is then scanned again during each of the succeeding time cycles 5 to 17, and the analog values D to Q determined are converted in the way described, stored in the store 51 and during the succeeding time cycle in each case, 6 to 18, are rolled-out from the store and passed as control pulses to the associated control signal leads.

The analog value I determined during the tenth time cycle corresponds to about 510 digital values. Therefore on the output lead 48 from the divider circuit there appears a "26" and on the output lead 49 a "10". Consequently during the succeeding twelfth time cycle only 26 storage locations are set in the store 51 and for the twenty-sixth storage location a delay signal is calculated by the arithmetic unit 54, which corresponds to about half the cycle time and brings about the delayed control pulse I'. The same goes for the control pulses K', L', N', O' and P'.

As has already been described above, to compensate the time of calculation and storage, the control pulses which correspond to a scanning of the analog signal effected during a given time cycle are released by the control pulse generator only during the succeeding time cycle. That has the result that the signal 82 composed of pulses on the series lead connecting the outputs from the switching channels and the output signal 83 from the switching amplifier are shifted with respect to the input signal to the amplifier by the duration of one time cycle by about one and a half time cycles respectively.

As has already been described above, the switched-on time for the pulse transformer in the switching channels is limited, for which reason the channels are combined in pairs into switching stages. The control pulse generator 53 is correspondingly designed so that the contents of one storage cell are passed alternately to the two control signal leads of the associated switching stage. The switching-over between the signal leads for the switching channels in the various switching stages is thereby effected not simultaneously but with a time shift, as is shown in FIG. 4 for the five switching stages 71 to 75 and the corresponding switched-on periods 60', 61'; 62',63'; 64',65'; 66', 67' and 68', 69'. The result of this is that only a quarter of the energized switching channels get switched over at the same point in time.

As may be observed from FIG. 4, in the case of the new method the analog signal is converted not into a maximum processable number of width-modulated pulses, independent of the instantaneous value of the amplitude, but into a number of pulses of maximum width proportional to the instantaneous value of the analog signal. In this way it is possible to form an analog signal with a minimum number of signals in pulse form or to amplify it in a switching amplifier by a minimum number of switching processes. That the switching losses in the switching amplifier may thereby be quite considerably reduced has already been mentioned in the introduction.

It goes without saying that the new method and the switching amplifier described may be modified in a large number of ways and adapted to certain working conditions. For example, it is possible to employ instead of the described wide control pulses also very short control pulses, with a switching-on pulse corresponding to the leading edge of the wide control pulse and a switching-off pulse corresponding to the trailing edge. Again, it is not necessary to associate one or more control leads with each switching stage. The switching-on and switching-off pulses may instead be provided with addresses and be fed by the time-multiplex method along a single control lead to all of the associated switching stages or channels. It is also unnecessary that the actuated switching stages simulate the variation of the analog signal with time, as is shown in FIG. 4 for simpler explanation of the method of operation. Because the output signals from the switching stages are added on the series lead, the amplified analog signal appearing at the output terminal 44 is always the same independently of which switching stage was switched on by which control signal and also independently of whether a switching stage is switched on and off by the same control signal.

The device described for the performance of the new method may be realized with commercial components known to anyone skilled in the art, for which reason description of them is expressly dispensed with here.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A switching amplifier for high power amplification of an analog low-frequency signal, comprising:
   a plurality of switching stages each of which can be independently switched on and off, and each of which has a switched-on condition in which a nearly constant voltage is delivered at a respective output;
   at least two switching channels connected in parallel within each of said switching stages, wherein each of said switching channels comprises a pulse transformer having a primary side connected to a voltage source via a switching element, and a secondary side connected to the output of the respective switching channel via a rectifier;
   an A/D converter for measuring at predetermined intervals of time the instantaneous value of the amplitude of said analog low frequency signal and for generating a digital value corresponding to said instantaneous amplitude value;
   a storage device having a plurality of storage cells each of which corresponds to one of said switching stages;
   means provided for setting a number of said storage cells corresponding to said digital value;
   a control-pulse generator which in accordance with the set storage cells generates control pulses for driving the respective switching stages, wherein the switching channels of said driven switching stages are alternately switched on and off by actuating their respective switching elements; and
   means provided for summing the output voltages of said switching channels and switching stages respectively.

2. A switching amplifier as claimed in claim 1, further comprising:
   said setting means comprising a divider circuit which is connected to the output of said A/D converter, and which divides said digital value into groups of digital values and a residual digital value; and
   means for addressing storage cells to be set in accordance with said groups of digital values.

3. A switching amplifier as claimed in claim 2, further comprising:
   an arithmetic unit which converts said residual digital value into a duration modulated control signal, and an additional switching stage provided for delivering a duration modulated output voltage in accordance with said control signal.

4. A method of amplifying an analog low-frequency signal, comprising the steps of:
  dividing a voltage range of said analog low-frequency signal into a fixed number of voltage bands of equal size;
  associating with each of said voltage bands at least one switching stage with at least two switching channels connected in parallel, wherein each of said at least two switching channels comprises a pulse transformer having a primary side connected to a voltage source via a switching element, and a secondary side connected to an output of the respective switching channel via a rectifier;
  measuring at predetermined intervals of time the instantaneous value of the amplitude of said analog low frequency signal;
  determining the number of said voltage bands corresponding to said measured instantaneous amplitude value, such that the sum of the voltage bands so determined is equal to said measured instantaneous amplitude value or less than said value by at most one of said voltage bands;
  comparing for each interval of time the number of voltage bands determined in said determining step with the number of voltage bands determined in the determining step of the preceding interval of time;
  switching on or off a number of switching stages corresponding to the difference between the numbers of voltage bands compared in said comparing step, wherein said switching channels of each of said switched-on switching stages are alternately switched on by alternately closing the respective switching elements; and
  summing up the output voltages of said switching channels to give an amplified equivalent of said analog low-frequency signal.

5. A method as claimed in claim 4, further comprising the step of:
  shifting the phase of the alternating on-and-off switching of said switching channels in said switched-on switching stages with respect to each other, said phase shifting amounting to one-quarter the interval amount of time for said alternating on-and-off switching.

6. A method as claimed in claim 5, further comprising the steps of:
  determining a residual amplitude value as a difference between said instantaneous amplitude value and said sum of said voltage bands;
  providing an additional switching stage associated with said residual amplitude value;
  switching said additional switching stage in a pulse-width modulated fashion such that the ratio of the duration of each pulse-width modulated pulse to the interval of time between successive measurements of said instantaneous voltage amplitude value is proportional to the ratio of said residual amplitude value to said instantaneous voltage amplitude value.

* * * * *